United States Patent [19]

Dyment

[11] 4,138,274
[45] Feb. 6, 1979

[54] METHOD OF PRODUCING OPTOELECTRONIC DEVICES WITH CONTROL OF LIGHT PROPAGATION BY PROTON BOMBARDMENT

[75] Inventor: John C. Dyment, Kanata, Canada

[73] Assignee: Northern Telecom Limited, Montreal, Canada

[21] Appl. No.: 900,293

[22] Filed: Apr. 26, 1978

Related U.S. Application Data

[62] Division of Ser. No. 765,900, Feb. 7, 1977, Pat. No. 4,115,150, which is a division of Ser. No. 694,333, Jun. 9, 1976, Pat. No. 4,080,617.

[51] Int. Cl.$^2$ .......................... H01S 3/00; H01S 3/06; H01S 3/18; H01L 21/225
[52] U.S. Cl. ...................................... 148/1.5; 148/175; 357/18; 331/94.5 H
[58] Field of Search ................ 357/18; 331/94.5 H; 148/1.5, 171, 175

[56] References Cited

U.S. PATENT DOCUMENTS

| | | | |
|---|---|---|---|
| 3,780,358 | 12/1973 | Thompson | 317/235 R |
| 3,801,391 | 4/1974 | Dyment et al. | 156/16 |
| 3,824,133 | 7/1974 | D'Asaro et al. | 148/1.5 |
| 3,849,790 | 11/1974 | Gottsmann et al. | 357/18 |
| 3,893,044 | 7/1975 | Dumke et al. | 331/94.5 H |
| 3,982,207 | 9/1976 | Dingle et al. | 331/94.5 H |
| 4,011,113 | 3/1977 | Thompson et al. | 148/175 |
| 4,077,817 | 3/1978 | Bellavance | 148/171 |

OTHER PUBLICATIONS

Tsukada, "GaAs-Ga$_{1-x}$Al$_x$As B-H . . . Lasers" Jr. Appl. Phys. 45 (1974) 4899.
DeGelormo et al, "Fabrication of . . . Laser" IBM - TDB, 16 (1973) 2156.
Dyment et al, "Optical . . . Properties of . . . GaAs" J. Appl. Phys. 44 (1973) 207.

Primary Examiner—L. Dewayne Rutledge
Assistant Examiner—Upendra Roy
Attorney, Agent, or Firm—Sidney T. Jelly

[57] ABSTRACT

In an optoelectronic device, light is restrained from propagating in one or both confining layers on either side of an active layer by forming one or more photon absorbing barriers in one, or both, confining layers. A photon absorbing barrier can be formed by proton bombardment of a confining layer, by producing a protrusion from the substrate into the adjacent confining layer, or by producing a protrusion from a capping layer into the other confining layer, or by combinations of these. Spaced apart barriers can define a device, or sections of a multisectioned device, for example a monolithic light emitting diode and modulator.

4 Claims, 14 Drawing Figures

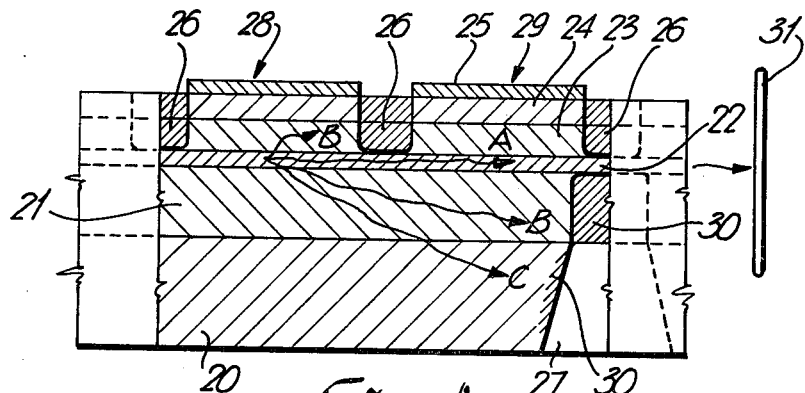
Fig-4
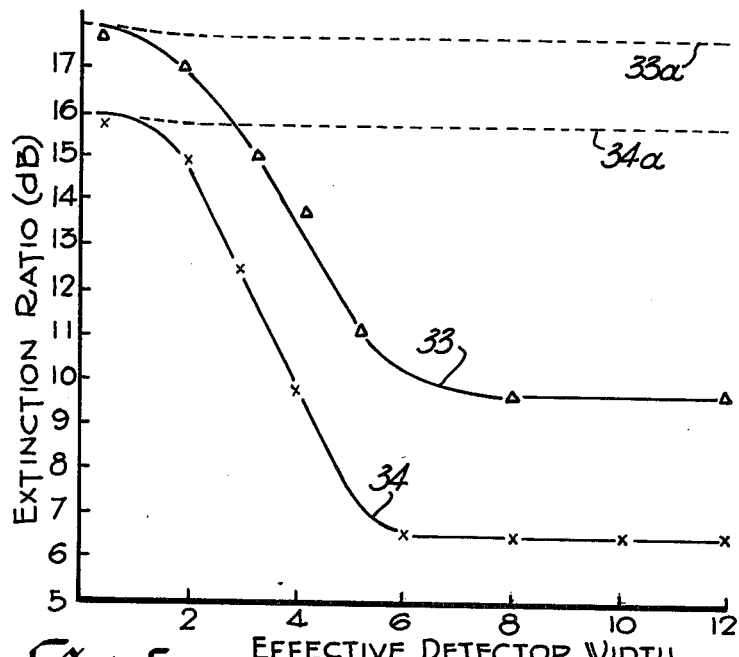
Fig-5  EFFECTIVE DETECTOR WIDTH AT MODULATOR EXIT FACE (μm)
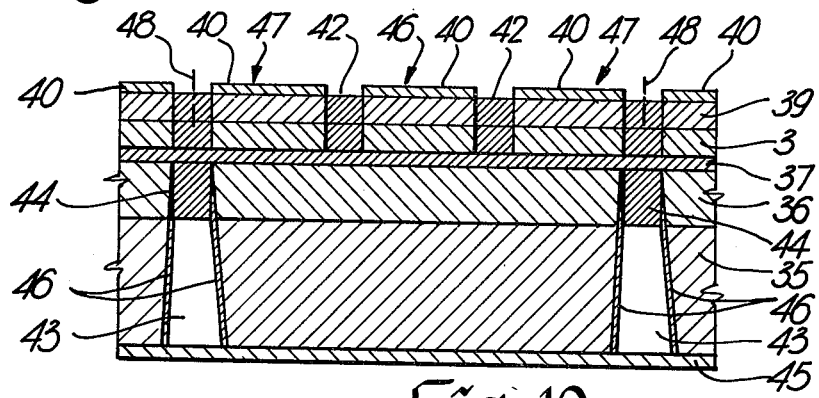
Fig-10

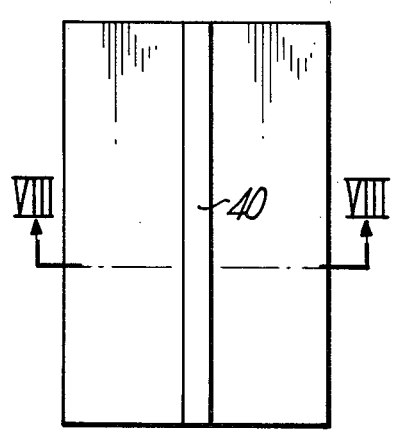
Fig-6-
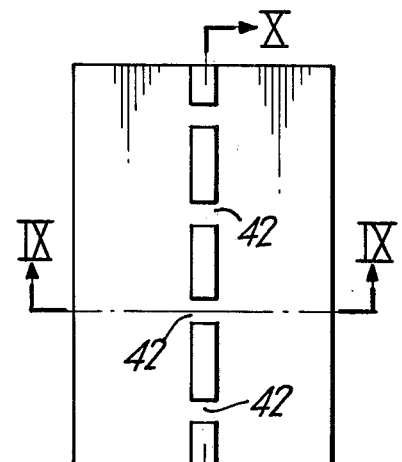
Fig-7-
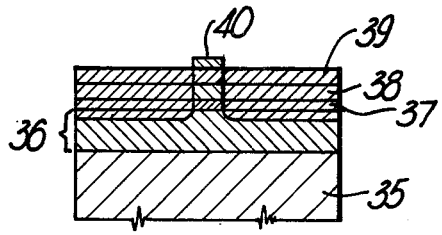
Fig-8-
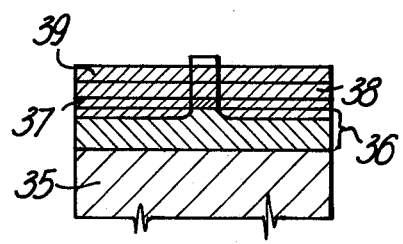
Fig-9-
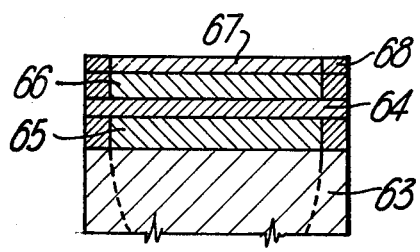
Fig-13-
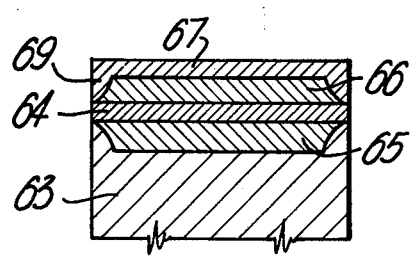
Fig-14-

METHOD OF PRODUCING OPTOELECTRONIC DEVICES WITH CONTROL OF LIGHT PROPAGATION BY PROTON BOMBARDMENT

This application is a divisional of application Ser. No. 765,900 filed Feb. 7, 1977, now U.S. Pat. No. 4,115,150 which in turn is a divisional of Ser. No. 694,333 filed 6-9-1976, now U.S. Pat. No. 4,080,617.

This invention relates to optoelectronic devices and the control of light propagation therein, particularly to at least reduce the emission of photons from, or into, other than the desired areas of a device.

In optoelectronic devices, such as light emitting diodes (LED's), lasers, modulators and detectors, there is often a need to accurately define the active region of these devices, that is the region at which light emission or light absorption takes place. For example, in heterostructure GaAs/GaAlAs devices, a fraction of the light which is either generated directly in the active layer (LED's or lasers) or coupled into the active region (modulators or detectors) will escape from the active or guiding layer since the confinement will not be perfect. Such unguided light may exit through the GaAlAs confining layers adjacent to the guiding layer and trigger undesired optical response of subsequent optical elements.

The present invention provides a way of at least reducing the effects of imperfect confinement by providing a barrier, or barriers to the unguided light in the confining layers. This invention will be readily understood by the following description of certain embodiments, by way of example, in conjunction with the accompanying drawings, in which:

FIG. 4 is a diagrammatic cross-section through an integrated LED-modulator device incorporating one form of the invention;

FIG. 5 illustrates the improvement in modulator extinction ratios, using the invention;

FIGS. 6 to 9 illustrate steps in the production of an LED emitter-modulator structure, incorporating one form of the invention, FIGS. 8 and 9 being cross-sections on the lines VIII—VIII and IX—IX of FIGS. 6 and 7 respectively;

FIG. 10 is a diagrammatic cross-section of the finished structure, as on the line X—X of FIG. 7;

FIGS. 13 and 14 illustrate diagrammatic cross-sections through two devices which have well-defined active or guiding layers into which optically absorbing barriers are introduced by proton bombardment or crystal growth techniques respectively.

The present invention provides a barrier, or barriers which are incorporated into the confining layer, or layers of double heterostructure devices to prevent unguided light in those confining layers from exiting through the side facets. This provides a variety of advantages for LED's, lasers, modulators, and detectors. One advantage is that the only light which exits from these devices comes from the active or guiding layer. This will essentially eliminate undesired optical responses generated by stray light. A second advantage is that the geometry of the active region is well-defined so that emitting areas can be made comparable in size to the cores of optical fibers which might be attached to the end faces. A third advantage occurs in electroabsorption or phase modulators in which the light which escapes into and propages along the confining layers will reduce the modulation depth. For example, integrated LED emitter-modulator structures can achieve up to 20dB extinction ratios via the process of electroabsorption. However these high extinction ratios are only achieved by limiting the area of the detector so that only light which exits from the active, or guiding layer is recorded by the detector. If the light which propagates outside the active, or guiding layer is also detected, then the extinction ratio is significantly reduced.

Figure 1:
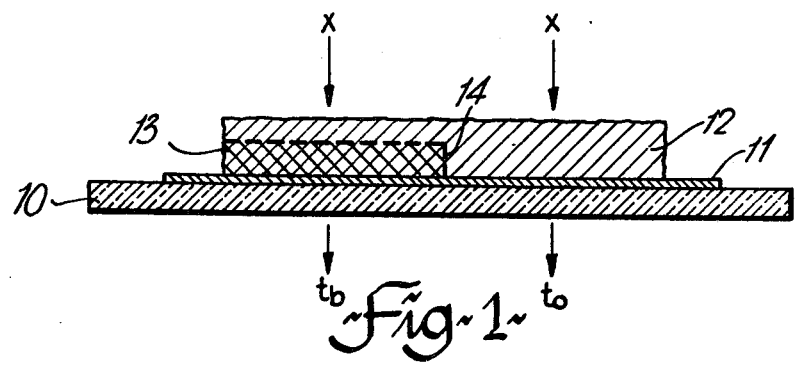
FIG. 1 is a diagrammatic cross-section through a device illustrating the basic concept of the invention.

In a typical double heterostructure device, the guiding or active layer consists of $Ga_{1-y}Al_yAs$ material with $y \lesssim 0.1$; such a layer has an optical absorption edge in the range 800–870 nm and will guide photons with wavelengths longer than the absorption edge value. It is proposed that one way of overcoming light spill of these photons into and out of the $Ga_{1-x}Al_xAs$ confining layers is by introducing optically absorbing regions into the confining layers by the method of proton bombardment. Thus photons from the guiding layer must be absorbed in a confining layer of completely different material (typically $Ga_{0.7}Al_{0.3}As$) where the band edge is near 680 nm. This is a completely different situation to that in which proton bombardment of GaAs provides absorption for wavelengths close to the GaAs absorption edge. The basic validity of the above proposal has been established using the device illustrated in FIG. 1. A 5 μM thick $Ga_{0.7}Al_{0.3}As$ layer was first grown on an n-GaAs substrate. Approximately one half of the area of this layer was bombarded at 390 keV, $3 \times 10^{15}$ cm$^{-2}$; the other half was shielded from the beam. The crystal was then glued to a glass slide with a transparent photoresist and the whole of the n-type substrate was removed by using a selective etch ($H_2O_2+NH_4OH$, pH = 8.70). After an etch time of about 60 minutes, only the 5 μm thick layer remained. In FIG. 1 the glass slide is indicated at 10, the photoresist layer at 11 and the 5 μm thick $Ga_{0.7}Al_{0.3}As$ layer is indicated at 12. The proton bombarded area is indicated at 13. Light from a monochromatic source was then passed through both the bombarded and nonbombarded regions of the crystal, as indicated by arrows X, and detected by a cooled photo-multipler.

Figure 2:
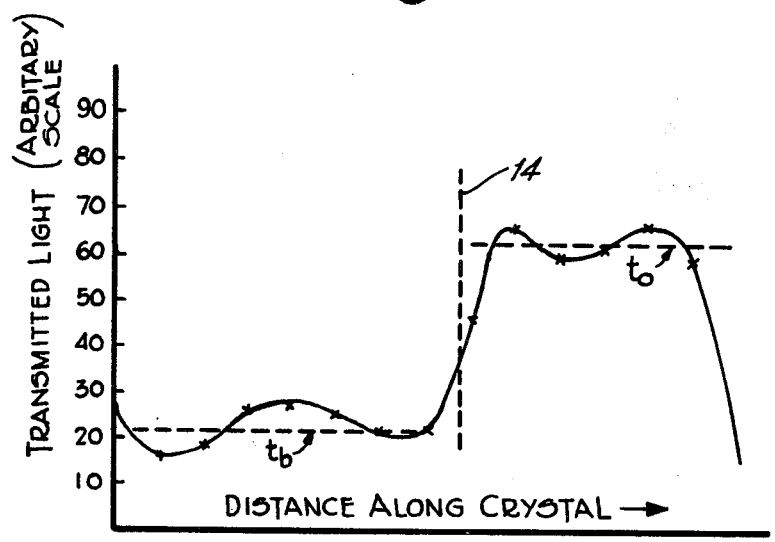
FIG. 2 is a curve illustrating the light transmission for different parts of the device in FIG. 1.

FIG. 2 illustrates a typical variation in the transmitted light variation across a crystal for a fixed wavelength of 750 nm. The undulations are due to surface roughness of the etched surface but the location of the boundary 14 between bombarded and nonbombarded regions is easily identified. The two intensities of light are indicated on FIG. 1, and as an average on FIG. 2, as $\tau_b$ and $\tau_o$ for bombarded and nonbombarded regions respectively.

Figure 3:
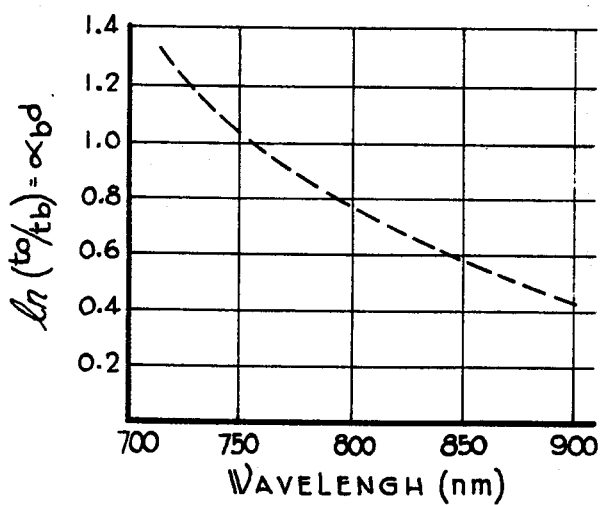
FIG. 3 is a curve illustrating the ratios of light transmission through bombarded and nonbombarded regions of a device as in FIG. 1, for different wavelengths.

FIG. 3 illustrates how the ratio of light transmission through the unbombarded and bombarded regions of a crystal (i.e. $\tau_o/\tau_b$) varies as a function of wavelength. As will be seen, the ratio varies from about 1.2 for wavelengths of 725 nm to about 0.45 for wavelengths of 900 nm.

As an example of a device employing the invention, an integrated LED-modulator structure is illustrated in FIG. 4. The structure illustrated is a double heterostructure comprising a GaAs substrate 20, a first $Ga_{1-x}Al_xAs$ ($x \simeq 0.3$) confining layer 21, an active GaAs layer 22, a second $Ga_{1-x}Al_xAs$ ($x \simeq 0.3$) confining layer 23 and an optional capping layer 24. A masking layer 25 is formed on the capping layer 24 and proton bombardment forms regions 26 of high optical absorption in the second confining layer 23 (and in the capping layer 24 although this is incidental). The conductivity type of the layers can vary provided there is the correct relationship. Thus the substrate is n-type, the first confining layer and the active layer are n-type while the second confining layer (and capping layer) are p-type. If the substrate is p-type, the first confining layer and active layer are also p-type and the second confining layer (and capping layer) are n-type.

Hole 27 is then etched through the substrate 20. A suitable etch is as referred to previously, for removal of the substrate in the preparation of the device of FIG. 1. Conveniently the etch is selective for GaAs, stopping at the first confining layer 21, the bottoms of the hole 27 being at the boundary between substrate 20 and confining layer 21. A further proton bombardment is carried out from the substrate side of the structure to form a region 30 of high optical absorption at the bottom of the hole as well as along the periphery of the hole. The LED emitter section is at 28 and is energized by an appropriate potential or bias applied to the capping layer 24 in the emitter section and to the contact on the substrate 20. The modulator section 29 modulates the light emission from the active layer 22 in the emitter section, again by suitable potentials applied to the capping layer 24 and substrate 20.

The photons labelled B and C pass into the confining layers 21 and 23. Photons B will be absorbed by the proton damaged regions 26 and 27. The photons C will be absorbed to some extent by the proton damage at the periphery of the hole 26, indicated at 30. Complete absorption in the substrate can be assured if the n-type active layer 22 contains a small amount of Al which will shift the photon energy to values beyond the absorption edge of substrate 20. A detector is indicated at 31.

The possible improvement gains are illustrated by the curves in FIG. 5. The curves illustrate extinction ratio versus effective detector width at the modulator exit face. The highest extinction ratios are obtained when the effective detector width is narrower than the thickness of the guiding layer 22. When the effective width is greater than the guiding layer 22, so that light from the confining layers 21 and 23 is also included, the extinction ratio is reduced by 8–10 dB. By preventing the propagation of light rays through the confining layers of the modulator, the size of the effective detector width is not so critical. A wider effective detector width can be used and still obtain high extinction ratios. The extinction ratio will be improved by 8–10 dB relative to the same wider effective detector width without photon absorption. Curves 33 and 34 illustrate extinction ratio versus effective detector width for two conventional modulator devices operated at negative biases of 24 volts and 18 volts, respectively. Curves 33a and 34a illustrate the improvements achieved by introducing optical absorption into the confining layers by proton bombardment.

FIGS. 6 to 9 illustrate two steps in producing a high-speed high extinction ratio LED emitter-modulator structure, and FIG. 10 is a cross-section through the structure–on the line X—X of FIG. 7. The structure illustrated is a double heterostructure, as in FIG. 4, with a substrate 35, first confining layer 36, active or guiding layer 37, a second confining layer 38 and optional capping layer 39. The conductivity type of substrate 35 and layers 36, 37, 38 and 39 as previously described in relation to FIG. 4. High speed operation is obtained by limiting the junction capacity with a first proton bombardment. A metal stripe 40 is produced on the capping layer 39 and the structure bombarded. The bombardment alters the layers 39, 38 and 37, also part of the layer 36, as seen in FIG. 8. Narrow gaps 42 are then etched into the metal stripe and a second proton bombardment which alters only layers 39 and 38 forms electrical isolation between sections and ensures optical absorption in the top confining layer 38. The structure is then as in FIG. 9. Finally holes 43 are etched through the substrate 35 to the first confining layer 36 and a third proton bombardment is performed into these holes from the substrate side, to form regions 44 which provide optical isolations (absorption) in the lower, or first, confining layer. The mask layer for etching the holes 43 and masking from the third bombardment is indicated at 45. A certain amount of bombardment damage also occurs on the sides of the holes 43 at 46. For both second and third bombardments the proton beam energy is accurately controlled to ensure that protons penetrate only to a minimum extent into the active or guiding layer 37. In FIG. 10, the emitter section is the central one third portion between the bombarded regions 42. The structure illustrated in FIG. 10 has one LED emitter section 46 with modulator sections 47 positioned on either side. These devices are most conveniently made by fabricating a large number of sections on a common substrate and then dividing along the dashed line 48 (FIG. 10).

Figure 11:
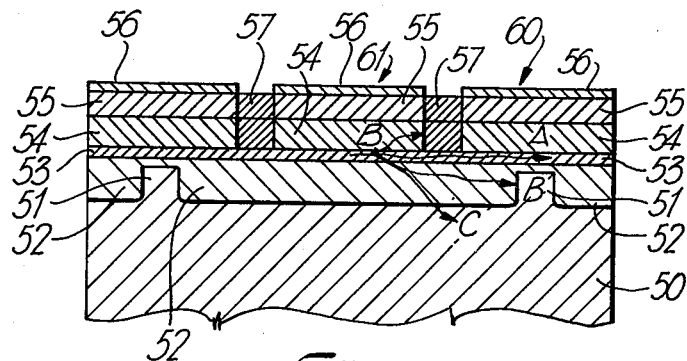
FIG. 11 is a diagrammatic cross-section of a finished structure incorporating another form of the invention.

In relation to FIGS. 6 to 10, if high modulator speed is not critical, the first proton bombardment can be eliminated. The only bombardment required is that which creates regions 42, (now extending in stripes all across the crystal) to provide electrical (and optical) isolation between sections and prevent propagation of leakage photons in the second confining layer 38. It is also possible to provide an alternative optical isolation structure for the first confining layer. In FIG. 11 a photon absorbing region is formed by initial profiling of a substrate. As illustrated in FIG. 11 a substrate 50 is masked and etched on one surface to form upstanding ribs or ridges 51. The first confining layer 52 is then formed followed by formation of the active or guiding layer 53. The thickness of layer 52 can be controlled for careful crystal growth such that the gap between the top surface of the ribs 51 and active layer 53 is small. The second confining layer 54 is formed followed by capping layer 55. A masking layer 56 is formed on the capping layer 55 and isolation regions 57 are formed by proton bombardment through layers 54 and 55 down to the upper surface of the active or guiding layer 53. The proton bombardment regions 57 prevent propagation of photons B along the upper or second confining layer 54 into the modulator section 60, from the emitter section 61, while the ribs 51 absorb the photons B propagating in the lower or first confining layer 52. The photons C are absorbed in the substrate. To ensure substantially complete absorption of unwanted protons the active layer 53 contains some Al, having the form $n-Ga_{1-y}Al_yAs$ with $y \simeq 0.1$. The photons A will be the only light to emit from the emitter 61 and propagate through the modulator 60.

Figure 12:
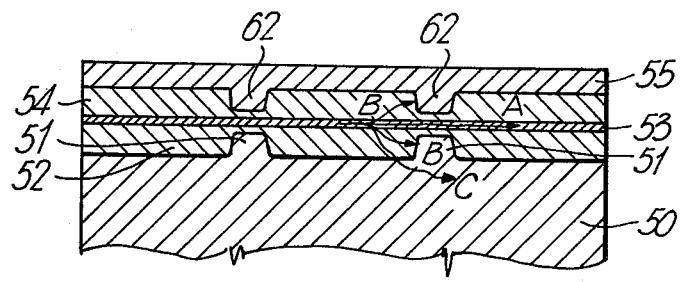
FIG. 12 is a diagrammatic cross-section of a structure, similar to that of FIG. 11, but incorporating the present invention in a further form.

As an alternative to the proton bombarded regions 57 which were used in FIG. 11 to provide optical absorption, some devices can effectively utilize profiling plus crystal growth techniques to provide the required optical absorption in both confining layers. This is illustrated in FIG. 12 using the same references as in FIG. 11 where applicable. In this case, upstanding ridges 51 provide optical absorption in the first confining layer while inverted ridges 62 provide optical absorption in the second confining layer. In such an arrangement the capping layer 55 is not optional and would have properties the same as substrate 50, that is, be essentially GaAs (with little or no Al content). This would ensure absorption of photons B provided the guiding or active layer 53 is of GaAlAs, for example $Ga_{0.9}Al_{0.1}As$.

In addition to the integrated emitter-modulator devices discussed previously, the inventions are applicable to many discrete optoelectronic devices such as LED's, laser, modulators and detectors. Diagrammatic cross-sections are shown in FIGS. 13 and 14 for the cases of optical barriers introduced by the techniques of proton bombardment and crystal growth, respectively. In each case a well-defined active or guiding layer is defined which provides those advantages discussed previously. In these devices, the structure comprises a substrate 63 with a p- or n-type active layer 64 and confining layers 65 and 66 on either side of the active layer. A capping layer 67 is on top of confining layer 66. Substrate and first confining layer are typically n-type while second confining layer and capping layer are of p-type. Precise definition of the active layer is provided at the exit facets at 68 by proton bombardment in FIG. 13 and at 69 by crystal growth in FIG. 14.

What is claimed is:

1. A method of producing an optoelectronic device, comprising:
    etching one surface of a substrate of semiconductor material to produce at least one protrusion extending normal to said surface of said substrate;
    forming a first confining layer on said substrate, said layer extending over said protrusion, said layer and said substrate the same conductivity type;
    forming an active layer on said first confining layer and a second confining layer on said active layer, said second confining layer being of opposite conductivity type as said first confining layer and said active layer being of the same conductivity type as one of said confining layers;
    said protrusion forming a photon absorbing barrier.

2. A method as claimed in claim 1, including etching said second confining layer to form at least one aperture extending to said active layer; and
    forming a capping layer of semiconductive material on said second confining layer of the same conductivity type as said second confining layer, said capping layer extending into said aperture and forming a photon absorbing barrier.

3. A method as claimed in claim 1, including forming a plurality of spaced apart protrusions on said substrate.

4. A method as claimed in claim 1, including proton bombarding at least one region in said first confining layer to form a photon absorbing barrier in said first confining layer.